United States Patent
Tung

(10) Patent No.: US 6,285,059 B1
(45) Date of Patent: Sep. 4, 2001

(54) STRUCTURE FOR LATERALLY DIFFUSED METAL-OXIDE SEMICONDUCTOR

(75) Inventor: Ming-Tsung Tung, Hsin-Chu Shian (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/271,561

(22) Filed: Mar. 18, 1999

(51) Int. Cl.$^7$ .................................................. H01L 29/76
(52) U.S. Cl. .................. 257/335; 257/305; 257/306; 257/330; 257/333; 257/335
(58) Field of Search ................................ 257/330, 333, 257/335, 305, 306

(56) References Cited

U.S. PATENT DOCUMENTS

| | | | |
|---|---|---|---|
| 4,963,970 | * 10/1990 | Throngnumchai et al. | 357/23.4 |
| 5,317,180 | * 5/1994 | Hutter et al. | 257/337 |
| 5,442,214 | * 8/1995 | Yang | 257/328 |
| 5,504,360 | * 4/1996 | Tokura et al. | 257/342 |
| 5,574,294 | * 11/1996 | Shepard | 257/66 |
| 5,723,891 | * 3/1998 | Malhi | 257/333 |
| 5,844,275 | * 12/1998 | Kitamura et al. | 257/335 |
| 5,923,064 | * 7/1999 | Abe | 257/327 |
| 5,949,103 | * 9/1999 | Lee | 257/324 |
| 5,952,702 | * 9/1999 | Gardner et al. | 257/408 |
| 5,981,996 | * 11/1999 | Fujishima | 257/335 |
| 5,998,274 | * 12/1998 | Akram et al. | 438/306 |

FOREIGN PATENT DOCUMENTS

| | | | |
|---|---|---|---|
| 000570595 | * 5/1993 | (JP) | 257/335 |
| 405114730 | * 5/1993 | (JP) | 257/335 |
| 406005868 | * 1/1994 | (JP) | 257/335 |
| 406021448 | * 1/1994 | (JP) | 257/335 |
| 406132527 | * 5/1994 | (JP) | 257/335 |

* cited by examiner

*Primary Examiner*—Eddie Lee
*Assistant Examiner*—Edgardo Ortiz
(74) *Attorney, Agent, or Firm*—Powell, Goldstein, Frazer & Murphy LLP

(57) ABSTRACT

A structure for forming a laterally diffused metal-oxide semiconductor is disclosed. The structure will include the following portions. They are a semiconductor layer with a conductivity type, a field insulating region into the semiconductor layer, a gate electrode formed over at least a portion of a channel region and insulated therefrom. The first drain region without an oxide top surface is formed beside one side of the gate electrode into the semiconductor layer. A second drain region is formed in the semiconductor layer. Also, a lightly doped portion borders the channel region and the neighbouring field insulating region. The main portion neighbors the oxide top surface and is spaced from the channel region by the lightly doped portion. The main portion has a second doping concentration that is less than the first doping concentration. The deep portion has a third doping concentration that is less than the second doping concentration.

6 Claims, 2 Drawing Sheets

STRUCTURE FOR LATERALLY DIFFUSED METAL-OXIDE SEMICONDUCTOR

BACKGROUND OF THE INVENTION

1. Field of the Invention

The present invention relates to a process of producing a Laterally Diffused Metal Oxide Semiconductor (LDMOS) transistor, and, more particularly, to a structure of an LDMOS transistor having reduced dimensions, reduced leakage, and a reduced propensity to latch-up.

2. Description of the Prior Art

The LDMOS (Laterally Diffused Metal-Oxide Semiconductor) is usually used in high-voltage integrated circuits and may generally be manufactured using some of the same techniques used to fabricate the low voltage circuitry or logic circuitry. Hence, a commonly used high-voltage element for these circuits is the laterally diffused Metal-Oxide transistor (LDMOS). Conventional LDMOS structures are first discussed to establish a basic understanding of the present invention.

For example, FIG. 1 shows a cross-sectional view of the structure of a conventional LDMOS transistor. The LDMOS transistor has a P-type substrate 10, a V-shaped trench 11, a P-type body region 12, a N$^+$ drain region 15, gate oxide 16, and an oxide layer 17. In this structure, the V-shaped trench 11 is used to reduce the dimension of the entire LDMOS transistor.

The N$^+$ source region 13, the P-type body region 12, and the P-type substrate 10 form a vertical parasitic PNP transistor. And the vertically projecting area of the N$^+$ source region 13 is relatively large, thus the leakage caused by the parasitic PNP transistor is relatively large and its propensity to cause latch-up problems is a drawback.

SUMMARY OF THE INVENTION

In accordance with the present invention, a method is provided for forming an LDMOS transistor that substantially has reduced dimensions, reduced leakage, and a reduced propensity to latch-up.

According to FIG. 2, the LDMOS transistor of the present invention includes the following portions. They are P substrate 20, silicon oxide 22, N-well 23, 23A and 23B, P-well 24, 24A and 24B, oxide layer 26 and N+-type doped polysilicon 28.

Generally the lightly doped portion is doped with dopants of the conductivity type. There is a second doping concentration, which is less than the first doping concentration. Consequentially a main portion of said first drain/source region is formed within the semiconductor layer. Therefore the main portion neighbouring the field insulating region/the oxide top surface and adjacent the lightly doped portion. Also the main portion disposed above the deep portion as well as the main portion is doped with dopants of the conductivity type and owns to a third doping concentration, which is less than the first doping concentration and is greater than said second doping concentration.

Consequently a main portion of the second drain/source region adjacent the lightly doped portion of the second drain/source region is formed. The main portion of the first drain/source region is formed at the same time as the main portion of said second drain/source region. Finally steps of forming a second drain/source region further comprise the step of forming a deep portion of the second drain/source region within the semiconductor layer and is spaced from the field insulating region/the oxide top surface by the lightly doped portion and the main portion.

In one embodiment, the object of the present invention is to provide a method of producing an LDMOS transistor. The above objects are fulfilled by providing a method of producing an LDMOS transistor on a substrate of a first conductivity type.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

Figure 1:
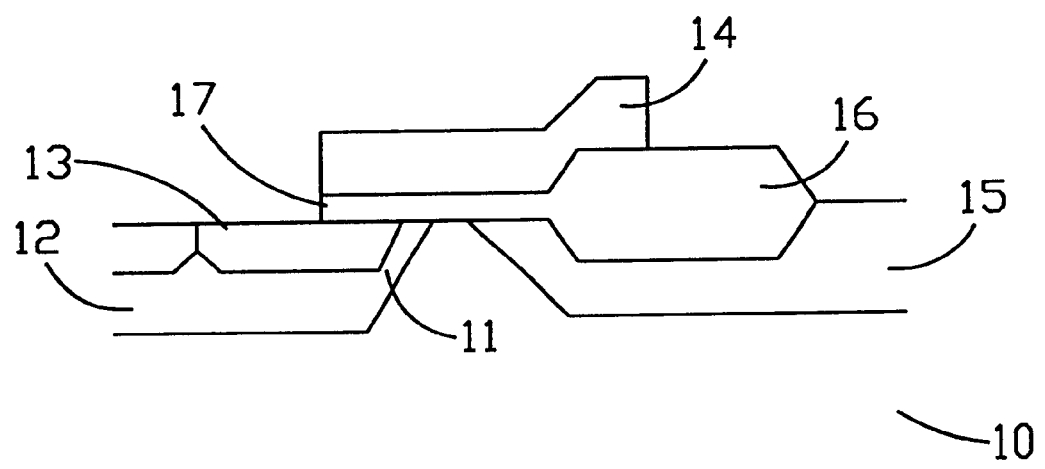
FIG. 1 is a sectional view of a LDMOS having a conventional source/drain.
Figure 2:
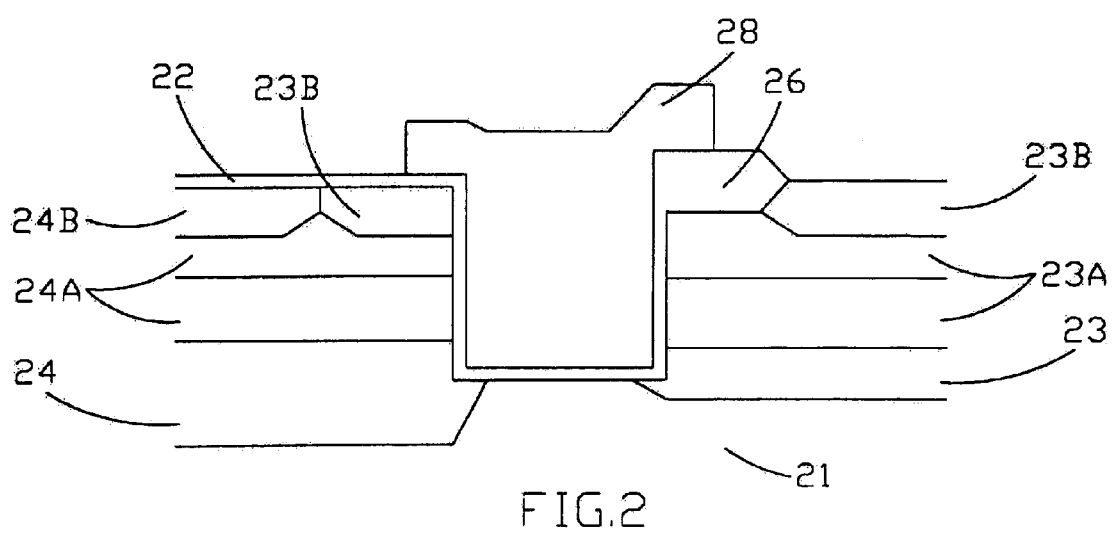
FIG. 2 is a sectional views showing in combination an embodiment of the present invention.

Therefore according to FIG. 2, the following portions are included in the present invention. They are P substrate 21, silicon oxide 22, N-well 23, 23A, P-well 24, 24A, oxide layer 26 and N$^+$-type doped polysilicon 28. In the structure mentioned above, the implanted regions 23, 23A, 24, and 24A are vertically stacked as shown in the figure, and are used as a vertical well of the device. They are a semiconductor layer with a conductivity tape, a field insulating region into the semiconductor layer, a gate electrode formed over at least a portion of a channel region and insulated therefrom. The first drain region of the conductivity tape that is without an oxide top surface is formed beside one side of the gate electrode into said semiconductor layer. The first drain region and a second drain region of said conductivity tape that is formed in the semiconductor layer and the second drain region is spaced from the first drain region by a channel region. Also, a lightly doped portion of the conductivity tape is bordered the channel region and neighboured the field insulating region. The lightly doped portion owns a first doping concentration. The main portion of the conductivity tape neighbours the field insulating region and the main portion of the conductivity tape is spaced from the channel region by the lightly doped portion of the conductivity. Here, the main portion owns a second doping concentration that is less than the first doping concentration. And a deep portion of the conductivity tape is formed within the layer and spaced from the top surface by the lightly doped portion and the main portion. The deep portion owns a third doping concentration that is less than the second doping concentration. And a first source region of the conductivity tape with the oxide top surface is formed beside another side of the gate electrode into the semiconductor layer, that will comprise the following portion. A second source region of the first conductivity typed is formed in the semiconductor layer spaced from the first source region by a channel region. A lightly doped portion of the conductivity tape borders the channel region and neighbours the oxide top surface. The lightly doped portion owns a first doping concentration.

The main portion of the conductivity tape neighbours the oxide top surface and is spaced from the channel region by the lightly doped portion. Also the main portion has a second doping concentration that is less than the first doping concentration. In addition, a deep portion of the conductivity tape formed within the layer and spaced from the oxide top surface by the lightly doped portion and the main portion. The deep portion has a third doping concentration that is less than the second doping concentration.

The field insulating region is formed in the semiconductor layer to shield the device from other devices formed in the layer. The channel region is formed under the field insulation region. The semiconductor layer comprises silicon. The gate electrode comprises polysilicon. The first and second source/drain regions comprise n-doped semiconductor and p-doped semiconductor. The field insulating region neighbours a sidewall of the gate electrode. The semiconductor layer comprises a semiconductor substrate. The deep portion is formed within the lightly doped portion. The deep portion is disposed below the main portion and abuts the main portion.

Usually the first drain/source region comprises a lightly doped portion of the conductivity tape neighbouring the channel region and bordering the field insulating region/the oxide top surface. The lightly doped portion a first doping concentration. The main portion of the conductivity tape borders the field insulating/the oxide top surface region and is spaced from the channel region by the lightly doped portion. The main portion has a second doping concentration that is less than the first doping concentration. The deep portion of the first conductivity tape is formed within the drain/source and is spaced from the field insulating region/the oxide top surface by the lightly doped portions and the main portion. The deep portion owns a third doping concentration that is less than the first doping concentration and is less than the second doping concentration.

While the invention has been described by way of examples and in terms of two preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

Although specific embodiments have been illustrated and described, it will be obvious to those skilled in the art that various modifications may be made without departing from what is intended to be limited solely by the appended claims.

What is claimed is:

1. A laterally diffused metal-oxide semiconductor device, comprising:

a gate region formed in a trench of a semiconductor substrate;

a source region adjacent said gate region, said source region being disposed in and contacted from the top of the semiconductor substrate;

a drain region spaced from said source region by said gate region, said drain region being disposed in and contacted from the top of the semiconductor substrate;

a field insulating region disposed between said gate region and said drain region;

a positive well region under and contacting with said source region, said positive well region comprising a first layer and a second layer under said first layer, the doping concentration of said first layer larger than that of said second layer;

a negative well region under and contacting with said drain region, said negative well region comprising a first layer and a second layer under said first layer, the doping concentration of said first layer larger than that of said second layer;

a channel region formed along the sidewalls and bottom of said gate region, said channel region overlapping a portion of said positive well and a portion of said negative well; and an oxide region disposed between said gate region and said drain region/source region.

2. The device according to claim 1, wherein said first layer of said negative well region has a doping concentration larger than said second layer of said negative well region.

3. The device according to claim 1, wherein said first layer of said positive well region has a doping concentration larger than said second layer of said positive well region.

4. The device according to claim 1, wherein said semiconductor substrate comprises silicon.

5. The device according to claim 4, wherein said semiconductor substrate has conductivity opposite to said drain region.

6. The device according to claim 5, wherein said gate region comprises polysilicon.

* * * * *